(12) United States Patent
Liou et al.

(10) Patent No.: US 9,275,929 B2
(45) Date of Patent: Mar. 1, 2016

(54) PACKAGE ASSEMBLY HAVING A SEMICONDUCTOR SUBSTRATE

(71) Applicant: Marvell World Trade Ltd., St. Michael (BB)

(72) Inventors: Shiann-Ming Liou, Campbell, CA (US); Sehat Sutardja, Los Altos Hills, CA (US); Albert Wu, Palo Alto, CA (US); Chuan-Cheng Cheng, Fremont, CA (US); Chien-Chuan Wei, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/678,304

(22) Filed: Apr. 3, 2015

(65) Prior Publication Data

US 2015/0221577 A1 Aug. 6, 2015

Related U.S. Application Data

(63) Continuation of application No. 12/973,249, filed on Dec. 20, 2010, now abandoned.

(60) Provisional application No. 61/350,852, filed on Jun. 2, 2010, provisional application No. 61/347,156, filed (Continued)

(51) Int. Cl.
*H01L 21/50* (2006.01)
*H01L 21/48* (2006.01)
(Continued)

(52) U.S. Cl.
CPC ............. *H01L 23/42* (2013.01); *H01L 23/147* (2013.01); *H01L 23/3128* (2013.01); *H01L 23/49816* (2013.01); *H01L 23/49838* (2013.01);
(Continued)

(58) Field of Classification Search
CPC ................ H01L 23/42; H01L 23/3128; H01L 23/49816; H01L 23/147; H01L 24/16; H01L 24/11
USPC .......................................................... 438/122
See application file for complete search history.

(56) References Cited

U.S. PATENT DOCUMENTS 5,239,198 A 8/1993 Lin et al.
5,291,062 A 3/1994 Higgins, III
(Continued)

FOREIGN PATENT DOCUMENTS

CN 1538520 A 10/2004
CN 101208789 A 6/2008
(Continued)

OTHER PUBLICATIONS

Merriam Webster, "Unitary", Definition, retrieved on Feb. 18, 2015 at <<www.merriam-webster.com/dictionary/unitary>>, 3 pages.
(Continued)

*Primary Examiner* — Luan C Thai

(57) ABSTRACT

Embodiments of the present disclosure provide a method that includes providing a semiconductor substrate comprising a semiconductor material, forming a dielectric layer on the semiconductor substrate, forming an interconnect layer on the dielectric layer, attaching a semiconductor die to the semiconductor substrate, and electrically coupling an active side of the semiconductor die to the interconnect layer, the interconnect layer to route electrical signals of the semiconductor die. Other embodiments may be described and/or claimed.

20 Claims, 11 Drawing Sheets

Related U.S. Application Data on May 21, 2010, provisional application No. 61/333,542, filed on May 11, 2010, provisional application No. 61/328,556, filed on Apr. 27, 2010, provisional application No. 61/295,925, filed on Jan. 18, 2010.

(51) Int. Cl.

| | | |
|---|---|---|
| *H01L 23/42* | (2006.01) | |
| *H01L 23/14* | (2006.01) | |
| *H01L 23/31* | (2006.01) | |
| *H01L 23/498* | (2006.01) | |
| *H01L 23/60* | (2006.01) | |
| *H01L 23/00* | (2006.01) | |
| *H01L 25/065* | (2006.01) | |

(52) U.S. Cl.
CPC .............. *H01L23/60* (2013.01); *H01L 24/11* (2013.01); *H01L 24/16* (2013.01); *H01L 24/73* (2013.01); *H01L 25/0652* (2013.01); *H01L 25/0655* (2013.01); *H01L 25/0657* (2013.01); *H01L 24/48* (2013.01); *H01L 2224/1403* (2013.01); *H01L 2224/14181* (2013.01); *H01L 2224/16225* (2013.01); *H01L 2224/32145* (2013.01); *H01L 2224/32225* (2013.01); *H01L 2224/48091* (2013.01); *H01L 2224/48137* (2013.01); *H01L 2224/48145* (2013.01); *H01L 2224/48227* (2013.01); *H01L 2224/73204* (2013.01); *H01L 2224/73207* (2013.01); *H01L 2224/73265* (2013.01); *H01L 2225/0651* (2013.01); *H01L 2225/06506* (2013.01); *H01L 2225/06586* (2013.01); *H01L 2924/014* (2013.01); *H01L 2924/01005* (2013.01); *H01L 2924/01006* (2013.01); *H01L 2924/01013* (2013.01); *H01L 2924/01023* (2013.01); *H01L 2924/01029* (2013.01); *H01L 2924/01032* (2013.01); *H01L 2924/01033* (2013.01); *H01L 2924/01078* (2013.01); *H01L 2924/01079* (2013.01); *H01L 2924/01082* (2013.01); *H01L 2924/12044* (2013.01); *H01L 2924/14* (2013.01); *H01L 2924/15321* (2013.01); *H01L 2924/181* (2013.01); *H01L 2924/18161* (2013.01); *H01L 2924/19041* (2013.01)

(56) References Cited

U.S. PATENT DOCUMENTS

| | | | |
|---|---|---|---|
| 5,659,203 A | 8/1997 | Call et al. | |
| 5,793,117 A | 8/1998 | Shimada et al. | |
| 5,977,640 A | 11/1999 | Bertin et al. | |
| 6,222,246 B1 | 4/2001 | Mak et al. | |
| 6,285,559 B1 | 9/2001 | Fukiharu | |
| 6,356,453 B1 | 3/2002 | Juskey et al. | |
| 6,359,790 B1 | 3/2002 | Meyer-Berg | |
| 6,753,205 B2 | 6/2004 | Halahan | |
| 6,984,544 B2 | 1/2006 | Cloud et al. | |
| 7,268,012 B2 | 9/2007 | Jiang et al. | |
| 7,741,194 B2* | 6/2010 | Griffiths | H01L 21/6835 257/E21.122 |
| 7,777,351 B1* | 8/2010 | Berry | H01L 23/3128 257/778 |
| 7,808,075 B1 | 10/2010 | Cheng et al. | |
| 7,816,183 B2* | 10/2010 | Kawata | H01L 21/561 438/109 |
| 7,851,259 B2* | 12/2010 | Kim | H01L 25/0657 438/108 |
| 7,858,441 B2* | 12/2010 | Lin | H01L 23/49816 438/107 |
| 8,704,350 B2* | 4/2014 | Park | H01L 21/563 257/678 |
| 2001/0019853 A1 | 9/2001 | Kroner | |
| 2002/0006686 A1 | 1/2002 | Cloud et al. | |
| 2003/0160325 A1 | 8/2003 | Yoneda et al. | |
| 2003/0192176 A1 | 10/2003 | Eldridge et al. | |
| 2004/0178491 A1 | 9/2004 | Akram et al. | |
| 2005/0121686 A1 | 6/2005 | Keller et al. | |
| 2007/0035008 A1 | 2/2007 | Wu et al. | |
| 2008/0017968 A1* | 1/2008 | Choi | H01L 21/565 257/686 |
| 2008/0117607 A1 | 5/2008 | Murayama et al. | |
| 2008/0197491 A1 | 8/2008 | Matsui | |
| 2008/0315433 A1 | 12/2008 | Chen et al. | |
| 2009/0101897 A1 | 4/2009 | Murphy et al. | |
| 2009/0243100 A1 | 10/2009 | Akiyama | |
| 2009/0283899 A1 | 11/2009 | Yoon et al. | |
| 2009/0302485 A1 | 12/2009 | Fan | |
| 2010/0148336 A1 | 6/2010 | Do et al. | |
| 2010/0164079 A1 | 7/2010 | Dekker et al. | |
| 2010/0171205 A1* | 7/2010 | Chen | H01L 21/565 257/686 |

FOREIGN PATENT DOCUMENTS

| | | |
|---|---|---|
| CN | 101252118 A | 8/2008 |
| DE | 102005014049 A1 | 10/2006 |
| TW | I249231 B | 2/2006 |
| TW | 200625562 A1 | 7/2006 |
| TW | 200839983 A | 10/2008 |
| TW | 200933838 A | 8/2009 |
| TW | 201003994 A | 1/2010 |
| WO | WO2007/115371 A1 | 10/2007 |
| WO | WO2009070348 A1 | 6/2009 |
| WO | WO2010045187 A1 | 4/2010 |
| WO | WO2011097089 A2 | 8/2011 |

OTHER PUBLICATIONS

PCT Search Report mailed Feb. 5, 2013 for PCT application No. PCT/US12/59530, 10 pages.

PCT Search Report mailed Aug. 31. 2011 for PCT application No. PCT/US2011/022370, 18 pages.

International Preliminary Report on Patentability and Written Opinion for PCT Application No. PCT/US2010/061630 dated Aug. 2, 2012, 7 pgs.

* cited by examiner

PACKAGE ASSEMBLY HAVING A SEMICONDUCTOR SUBSTRATE

CROSS REFERENCE TO RELATED APPLICATIONS

The present disclosure is a continuation of U.S. patent application Ser. No. 12/973,249, filed Dec. 20, 2010, which claims priority to U.S. Provisional Patent Application No. 61/350,852, filed Jun. 2, 2010, and to U.S. Provisional Patent Application No. 61/347,156, filed May 21, 2010, and to U.S. Provisional Patent Application No. 61/333,542, filed May 11, 2010, and to U.S. Provisional Patent Application No. 61/328,556, filed Apr. 27, 2010, and to U.S. Provisional Patent Application No. 61/295,925, filed Jan. 18, 2010, the entire specifications of which are incorporated herein by reference.

TECHNICAL FIELD

Embodiments of the present disclosure relate to the field of integrated circuits, and more particularly, to techniques, structures, and configurations of semiconductor substrates for package assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on semiconductor dies that continue to scale in size to smaller dimensions. The shrinking dimensions of the semiconductor dies are challenging conventional substrate fabrication and/or package assembly technologies and configurations that are currently used to route electrical signals to or from the semiconductor die. For example, laminate substrate technologies may not produce sufficiently small features on a substrate to correspond with the finer pitches of interconnects or other signal-routing features formed on the semiconductor dies.

SUMMARY

In one embodiment, the present disclosure provides a method that includes providing a semiconductor substrate comprising a semiconductor material, forming a dielectric layer on the semiconductor substrate, forming an interconnect layer on the dielectric layer, attaching a semiconductor die to the semiconductor substrate, and electrically coupling an active side of the semiconductor die to the interconnect layer, the interconnect layer being configured to route electrical signals of the semiconductor die.

In another embodiment, the present disclosure provides an apparatus including a semiconductor substrate comprising a semiconductor material, a dielectric layer formed on the semiconductor substrate, an interconnect layer formed on the dielectric layer, and a semiconductor die attached to the semiconductor substrate, wherein an active side of the semiconductor die is electrically coupled to the interconnect layer, the interconnect layer to route electrical signals of the semiconductor die.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and configurations for integrated circuit (IC) package assemblies (referred to as "package assemblies" herein) using semiconductor substrates. In the following detailed description, reference is made to the accompanying drawings which form a part hereof, wherein like numerals designate like parts throughout. Other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down, over/under, and/or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Further-more, the terms "comprising," "including," "having," and the like, as used with respect to embodiments of the present disclosure, are synonymous.

Figure 1:
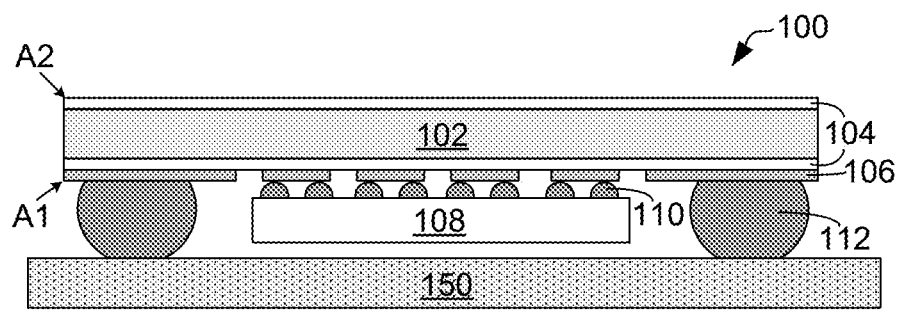
FIG. 1 schematically illustrates an example package assembly using a semiconductor substrate.

FIG. 1 schematically illustrates an example package assembly 100 using a semiconductor substrate 102. As used herein, the semiconductor substrate 102 refers to a substrate or interposer that substantially comprises a semiconductor material such as, for example, silicon (Si). That is, the bulk of the material of the semiconductor substrate is a semiconductor material. The semiconductor material can include crystalline and/or amorphous types of material. In the case of silicon, for example, the silicon can include single crystal and/or polysilicon types. In other embodiments, the semiconductor substrate 102 can include other semiconductor materials such as, for example, germanium, group III-V materials, or group II-VI materials, that can also benefit from the principles described herein.

Generally, the semiconductor substrate 102 is fabricated using technologies similar to those that are used to fabricate IC structures on a semiconductor die or chip (e.g., one or more semiconductor dies 108). For example, well-known patterning processes (e.g., lithography and/or etch) and deposition processes for fabricating IC devices on a semiconductor die can be used to form structures on the semiconductor substrate 102. By using semiconductor fabrication techniques, the semiconductor substrate 102 can include smaller features than other types of substrates such as laminate (e.g., organic) substrates. The semiconductor substrate 102 may facilitate routing of electrical signals for current semiconductor dies, which continue to shrink in size. For example, in some embodiments, the semiconductor substrate 102 allows for fine pitch Si-to-Si interconnects and final line routing between the semiconductor substrate 102 and the one or more semiconductor dies 108.

The semiconductor substrate 102 includes a first side, A1, and a second side, A2, that is disposed opposite to the first side A1. The first side A1 and the second side A2 generally refer to opposing surfaces of the semiconductor substrate 102 to facilitate the description of various configurations described herein and are not intended to be limited to a particular structure of the semiconductor substrate 102.

A dielectric layer 104 is formed on at least the first side A1 of the semiconductor substrate 102 and can also be formed on the second side A2 of the semiconductor substrate 102. The dielectric layer 104 can be formed by depositing an electrically insulative material such as, for example, silicon dioxide ($SiO_2$), silicon nitride (SiN), or silicon oxynitride ($SiO_xN_y$), where x and y represent suitable stoichiometric values, to substantially cover one or more surfaces of the semiconductor substrate 102, as shown. Other suitable electrically insulative materials can be used in other embodiments. The dielectric layer 104 can be formed by using a deposition technique including, for example, physical vapor deposition (PVD), chemical vapor deposition (CVD), and/or atomic layer deposition (ALD). Other suitable deposition techniques can be used in other embodiments.

The dielectric layer 104 can provide electrical isolation for features formed on the semiconductor substrate 102. For example, the dielectric layer 104 can be used to prevent shorting between electrically conductive features (e.g., one or more interconnect layers 106) formed on the dielectric layer 104 and the semiconductor material (e.g., silicon) of the semiconductor substrate 102. The dielectric layer 104 can further be used as a gate dielectric in the formation of one or more devices (e.g., capacitor 222 of FIG. 2C) on the semiconductor substrate 102.

One or more interconnect layers 106 are formed on the dielectric layer 104 to route electrical signals such as, for example, input/output (I/O) signals and/or power/ground signals, to and/or from one or more semiconductor dies 108 coupled to the semiconductor substrate 102. The one or more interconnect layers 106 can be formed by depositing and/or patterning an electrically conductive material such as, for example, a metal (e.g., copper or aluminum) or a doped semiconductor material (e.g., doped polysilicon). Other suitable electrically conductive materials can be used in other embodiments. The one or more interconnect layers 106 can include a variety of structures to route the electrical signals such as, for example, pads, lands, or traces. Although not depicted, a passivation layer comprising an electrically insulative material such as, for example, polyimide can be deposited on the one or more interconnect layers 106 and patterned to provide openings in the passivation layer to facilitate electrical coupling of the one or more semiconductor dies 108 to the one or more interconnect layers 106.

The one or more semiconductor dies 108 are attached to the first side A1 of the semiconductor substrate 102 using any suitable configuration including, for example, a flip-chip configuration, as depicted. Other suitable die-attach configurations such as, for example, a wire-bonding configuration can be used in other embodiments.

In the depicted embodiment, one or more bumps 110 are formed on the one or more semiconductor dies 108 and bonded to the one or more interconnect layers 106. The one or more bumps 110 generally comprise an electrically conductive material such as, for example, solder or other metal to route the electrical signals of the one or more semiconductor dies 108. According to various embodiments, the one or more bumps 110 comprise lead, gold, tin, copper, or lead-free materials, or combinations thereof. The one or more bumps 110 can have a variety of shapes including spherical, cylindrical, rectangular, or other shapes and can be formed using a bumping process, such as, for example, a controlled collapse chip connect (C4) process, stud-bumping, or other suitable bumping process.

The one or more bumps 110 can be formed on the one or more semiconductor dies 108 while the one or more semiconductor dies 108 are in either wafer or singulated form. The one or more semiconductor dies 108 can be attached to the semiconductor substrate 102 while the semiconductor substrate 102 is in either wafer or singulated form.

The one or more semiconductor dies 108 generally have an active side that includes a surface upon which a plurality of integrated circuit (IC) devices (not shown) such as transistors for logic and/or memory are formed and an inactive side that is disposed opposite to the active side. The active side of the one or more semiconductor dies 108 is electrically coupled to the one or more interconnect layers 106. In the depicted embodiment, the active side of the one or more semiconductor dies 108 is coupled to the one or more interconnect layers 106 using the one or more bumps 110. In other embodiments, the active side of the one or more semiconductor dies 108 is electrically coupled to the one or more interconnect layers 106 using other structures, such as, for example, one or more bonding wires (e.g., one or more bonding wires 934 of FIG. 9).

One or more package interconnect structures such as, for example, one or more solder balls 112 or bumps (e.g., the one or more bumps 520 of FIG. 5A) can be formed on the one or more interconnect layers 106 to further route the electrical signals of the one or more semiconductor dies 108. The one or more package interconnect structures generally comprise an electrically conductive material. In some embodiments, the one or more package interconnect structures are disposed adjacent to a peripheral portion of the semiconductor substrate 102 and the one or more semiconductor dies 108 are disposed adjacent to a central portion of the semiconductor substrate 102, as depicted. The one or more package interconnect structures can be formed in a variety of shapes including spherical, planar, polygon, or combinations thereof.

According to various embodiments, the one or more semiconductor dies 108 and the semiconductor substrate 102 are coupled together to form a package assembly. The package assembly 100 can be electrically coupled to other electrical devices such as a printed circuit board (PCB) 150 (e.g., motherboard) or module using the one or more package interconnect structures to further route the electrical signals of the one or more semiconductor dies 108. The one or more package interconnect structures (e.g., the one or more solder balls 112) can be sized, in some embodiments, to provide a gap between the one or more semiconductor dies 108 and the printed circuit board 150, as shown.

Figure 2A:
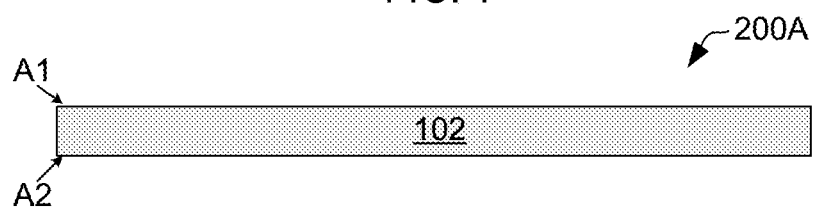
FIGS. 2A-2C schematically illustrate a semiconductor substrate subsequent to various process operations.
Figure 2B:
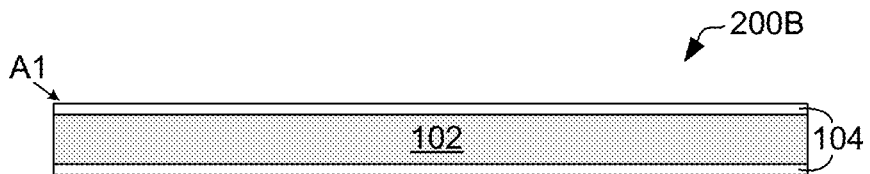
Figure 2C:
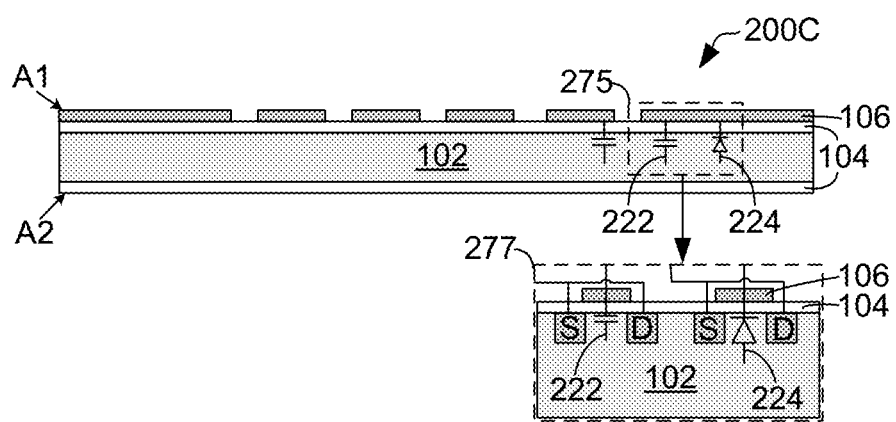

FIGS. 2A-2C schematically illustrate a semiconductor substrate 102 subsequent to various process operations. Referring to FIG. 2A, a semiconductor substrate 102 comprising a semiconductor material is depicted. The semiconductor substrate 102 can include, for example, opposing planar surfaces on the first side A1 and the second side A2. The semiconductor substrate 102 can be cut, for example, from an ingot of monocrystalline or polycrystalline semiconductor material. The semiconductor substrate 102 is generally in wafer form during processing described in connection with FIGS. 2A-2C, but can be in singulated form.

Referring to FIG. 2B, the semiconductor substrate 102 is depicted subsequent to formation of a dielectric layer 104 on at least the first side A1 of the semiconductor substrate 102. The dielectric layer 104 can be formed on the second side A2 in addition to the first side A1 in some embodiments.

Referring to FIG. 2C, the semiconductor substrate 102 is depicted subsequent to formation of one or more interconnect layers 106 on the dielectric layer 104 that is disposed on the first side A1 of the semiconductor substrate 102. A passivation layer (not shown) can be deposited on the one or more interconnect layers 106 and patterned to provide openings for electrically coupling one or more semiconductor dies (e.g., the one or more semiconductor dies 108 of FIG. 1) to the one or more interconnect layers 106.

According to various embodiments, one or more devices including IC devices and/or passive devices can be formed on the first side A1 of the semiconductor substrate 102. For example, an example capacitor 222 and an example electrostatic discharge (ESD) protection device 224 can be formed on the semiconductor substrate 102 as depicted in region 275 of the semiconductor substrate 102. An enlarged view of region 275 is depicted in region 277, which shows the capacitor 222 and the ESD protection device 224 in greater detail.

The capacitor 222 can be, for example, a de-coupling capacitor to reduce noise associated with the electrical signals such as power/ground signals of the one or more semiconductor dies. The capacitor 222 can include, for example, a metal-oxide-semiconductor (MOS) structure having a source region, S, and a drain region, D, formed in the semiconductor substrate 102. The source region S and the drain region D can be formed, for example, by using a doping or implant process to alter the electrical conductivity of the semiconductor material of the semiconductor substrate 102. In some embodiments, the source region S and/or the drain region D is implanted with a dopant to form an N-type junction in a P-type substrate. A P-type junction in an N-type substrate can be used in other embodiments. According to various embodiments, the source region S and the drain region D are formed prior to forming the dielectric layer 104 of FIG. 2B. The dielectric layer 104 can function as a gate dielectric for the MOS structure with the one or more interconnect layers 106 functioning as a gate electrode of the MOS structure. The gate electrode can include, for example, doped polysilicon or a metal. Other suitable techniques can be used to form a capacitor 222 in the semiconductor substrate 102 in other embodiments.

The ESD protection device 224 can include, for example, a diode to protect against electro-static discharge. The ESD protection device 224 can be formed, for example, by a doping or implant process to create an N-type region in the semiconductor substrate 102, which may be a P-type substrate in some embodiments. A P-type region can be formed in an N-type substrate in other embodiments. The ESD protection device 224 can be formed, for example, using techniques associated with forming MOS or bipolar devices. According to various embodiments, the ESD protection device 224 includes a complementary MOS (CMOS), bipolar, transient voltage suppression (TVS) and/or Zener diode or a metal oxide varistor (MOV). The ESD protection device 224 can include other suitable devices that protect against electro-static discharge in other embodiments.

Figure 3A:
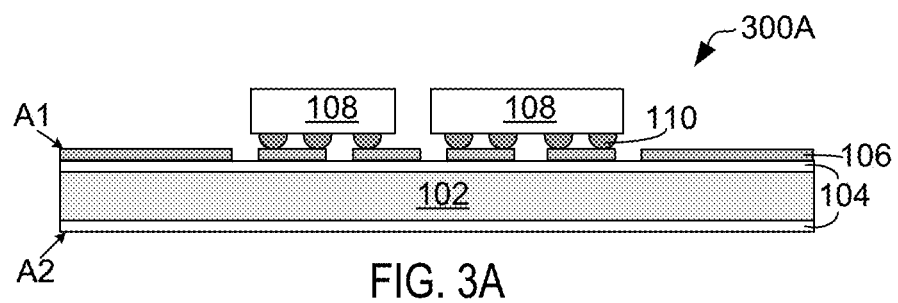
FIGS. 3A-3G schematically illustrate a package assembly using a semiconductor substrate subsequent to various process operations.

FIGS. 3A-3D schematically illustrate a package assembly using a semiconductor substrate 102 subsequent to various process operations. Referring to FIG. 3A, a package assembly 300A is depicted subsequent to attaching one or more semiconductor dies 108 to the first side A1 of the semiconductor substrate 102 in a flip-chip configuration. In some embodiments, one or more bumps 110 are formed on the active side of the one or more semiconductor dies 108 and subsequently bonded to the one or more interconnect layers 106 to provide an electrical pathway for the electrical signals of the one or more semiconductor dies 108. The one or more semiconductor dies 108 can be attached to the semiconductor substrate 102 when the semiconductor substrate 102 is in either wafer form or singulated form.

Figure 3B:
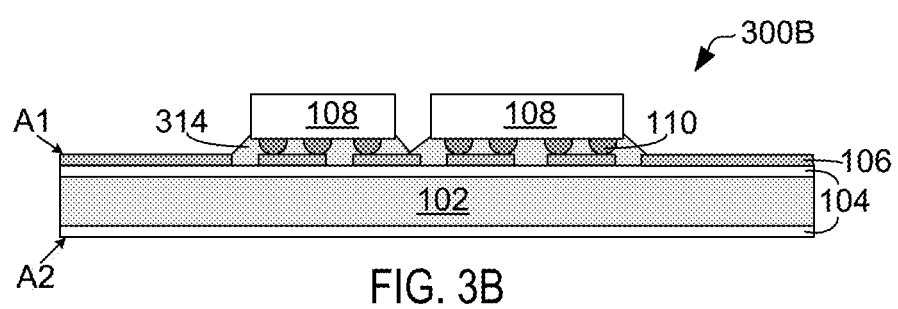

Referring to FIG. 3B, a package assembly 300B is depicted subsequent to depositing an underfill material 314 to substantially fill a region between the one or more semiconductor dies 108 and the semiconductor substrate 102. According to various embodiments, the underfill material 314 is deposited in liquid form by a liquid dispensing or injection process. The underfill material 314 can include, for example, an epoxy or other suitable electrically insulative material. The underfill material 314 generally increases adhesion between the one or more semiconductor dies 108 and the semiconductor substrate 102, provides additional electrical insulation between the one or more semiconductor bumps, and/or protects the one or more bumps 110 from moisture and oxidation.

Figure 3C:
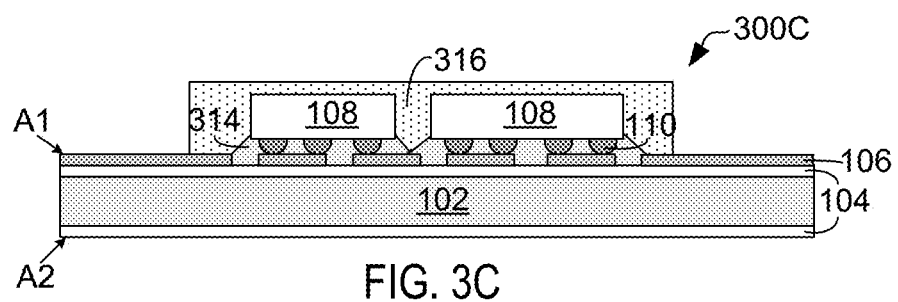

Referring to FIG. 3C, a package assembly 300C is depicted subsequent to depositing a molding compound 316 to substantially encapsulate the one or more semiconductor dies 108. The molding compound 316 generally protects the one or more semiconductor dies 108 from moisture, oxidation, or chipping associated with handling. The molding compound 316 may be used in conjunction with the underfill material 314, as depicted, in cases where the materials used for the molding compound 316 do not readily fill the region (e.g., due to a small pitch of the one or more bumps 110). According to various embodiments, the molding compound 316 is formed by depositing a resin (e.g., a thermosetting resin) in solid form (e.g., a powder) into a mold and applying heat and/or pressure to fuse the resin. In some embodiments, the molding compound 316 is not the same material as the underfill material 314.

Figure 3D:
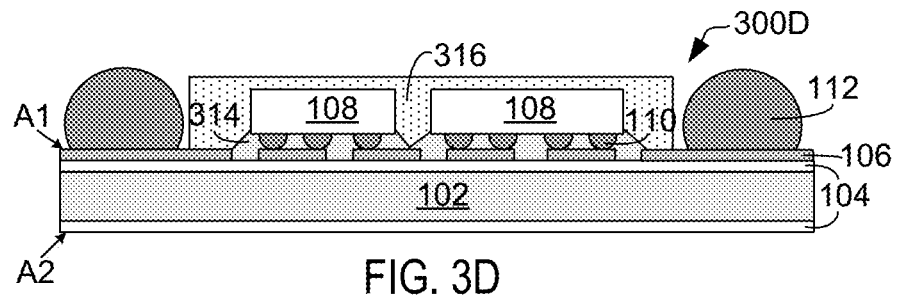

Referring to FIG. 3D, a package assembly 300D is depicted subsequent to forming one or more package interconnect structures such as solder balls 112 or bumps on the interconnect layer 106 to further route the electrical signals of the one or more semiconductor dies 108. For example, the solder balls 112 can be printed, electrically plated, or placed on designated locations such as bond pads of the one or more interconnect layers 106. The one or more package interconnect structures can be arranged, for example, in a single row or in multiple rows and can be formed in a variety of locations including a central or a peripheral portion of the package assembly 300D. In some embodiments, the package assembly 300D is a final package assembly. The final package assembly is an assembly that is ready to be mounted on another component such as a printed circuit board (e.g., the printed circuit board 150 of FIG. 1).

When the actions described in connection with FIGS. 3B-3D are performed on a semiconductor substrate 102 in wafer form, the semiconductor substrate 102 is further singulated by a suitable singulation process. According to various embodiments, the semiconductor substrate 102 can be singulated subsequent to the actions described in connection with FIG. 3A, FIG. 3B, FIG. 3C, or FIG. 3D.

In some embodiments, the one or more package interconnect structures (e.g., the one or more solder balls 112) can be formed on the semiconductor substrate 102 of the package assembly 300A to form a final package assembly. The final package assembly using the package assembly 300A may save costs associated with using an underfill material and/or molding compound. In some embodiments, the semiconductor substrate 102 comprises a material that has a coefficient of thermal expansion (CTE) that is substantially the same as a material of the one or more semiconductor dies 108. For example, the semiconductor substrate 102 and the one or more semiconductor dies 108 may both comprise silicon. In such a case, the stress of thermal expansion, which is generally mitigated by the underfill material 314 and/or the molding compound 316, is reduced because the semiconductor substrate 102 and the one or more semiconductor dies 108 have the same CTE. Thus, when the CTE is similar or the same for the semiconductor substrate 102 and the one or more semiconductor dies 108, the underfill material 314 and/or the molding compound 316 may not be used at all.

In some embodiments, the one or more package interconnect structures (e.g., the one or more solder balls 112) can be formed on the semiconductor substrate 102 of the package assembly 300B to form a final package assembly. The final package assembly using the underfill material 314 may increase reliability of joints such as solder joints associated with the one or more bumps 110 of the package assembly 300B.

Figure 3E:
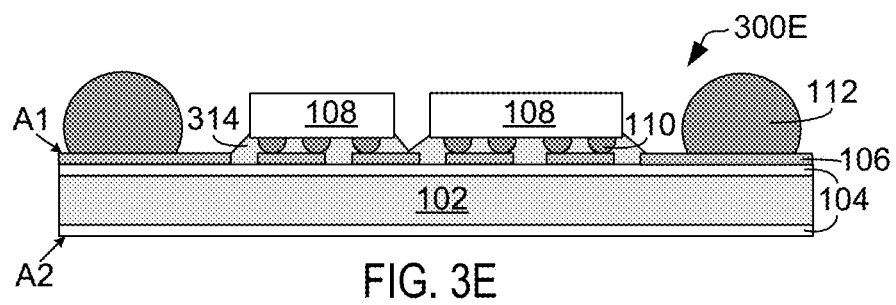
Figure 3F:
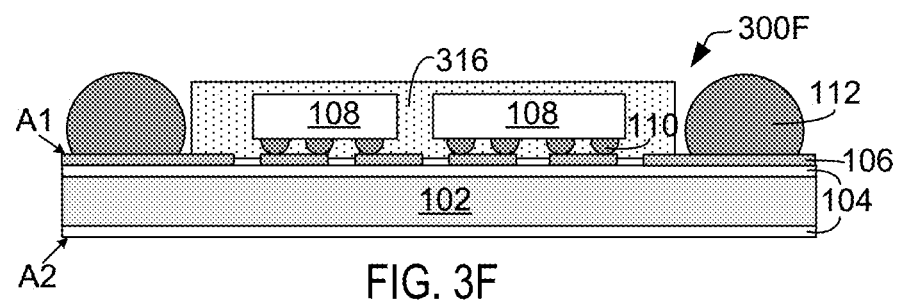
Figure 3G:
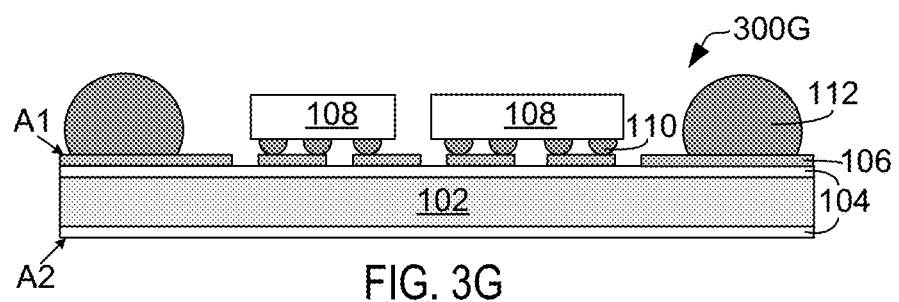

As previously discussed herein, when the CTE is similar or the same for the semiconductor substrate 102 and the one or more semiconductor dies 108, the underfill material 314 and/or the molding compound 316 may not be used at all. For example, FIG. 3E illustrates a package assembly 300E that is similar to the package assembly 3D of FIG. 3D, but without the molding compound 316 of the package assembly 3D of FIG. 3D. FIG. 3F illustrates a package assembly 300F that is similar to the package assembly 3D of FIG. 3D, but without the underfill material 314 of the package assembly 3D of FIG. 3D. FIG. 3G illustrates a package assembly 300G that is similar to the package assembly 3D of FIG. 3D, but without the underfill material 314 and the molding compound 316 of the package assembly 3D of FIG. 3D.

Figure 4A:
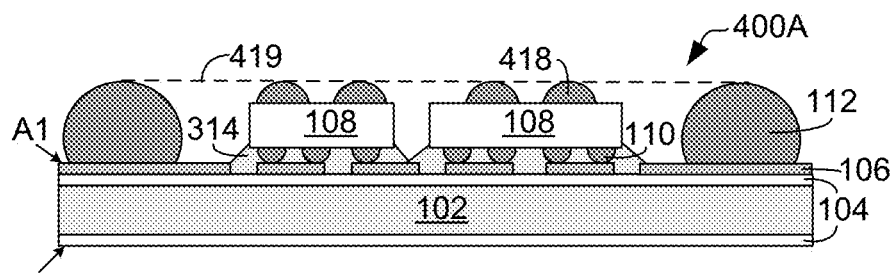
FIGS. 4A-4B schematically illustrate the package assembly of FIG. 3B subsequent to various process operations.
Figure 4B:
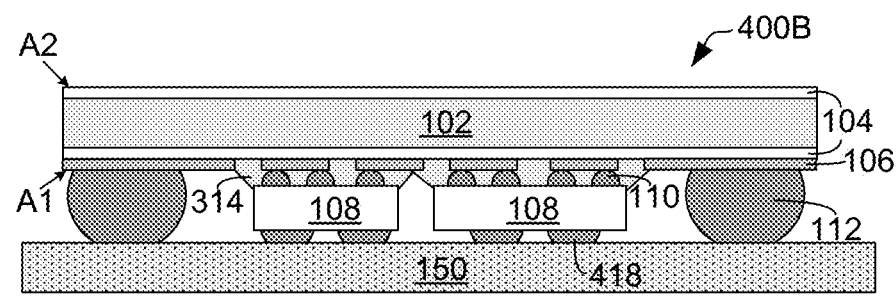

FIGS. 4A-4B schematically illustrate the package assembly 300B of FIG. 3B subsequent to various process operations. Although the package assembly 300B is used as an example to illustrate the principles of these embodiments, the principles can be suitably applied to other package assemblies described herein including, for example, the package assembly 300A.

Referring to FIG. 4A, a package assembly 400A is depicted subsequent to the formation of one or more package interconnect structures (e.g., solder balls 112) on the one or more interconnect layers 106 and the formation of one or more thermal dissipation structures (e.g., solder balls 418) on an inactive side of the one or more semiconductor dies 108, as shown. The one or more package interconnect structures and the one or more thermal dissipation structures can include other types of structures such as, for example, bumps in other embodiments. The one or more thermal dissipation structures generally comprise a thermally conductive material such as, for example, metal to provide a thermal path for heat dissipation. The one or more package interconnect structures and the one or more thermal dissipation structures can be sized to have respective surfaces that are substantially coplanar. For example, the solder balls 112 and the solder balls 418 can be sized to have a surface that substantially lies in the same plane 419 to facilitate connection to a substantially planar surface such as a printed circuit board (e.g., printed circuit board 150 of FIG. 4B). In some embodiments, the solder balls 112 are larger in size than the solder balls 418, as depicted.

The actions described in connection with FIG. 4A can be performed when the semiconductor substrate 102 is in either wafer form or singulated form. If in wafer form, the semiconductor substrate 102 is singulated prior to mounting the package assembly 400A on the printed circuit board.

Referring to FIG. 4B, a package assembly 400B is depicted subsequent to attachment of the one or more package interconnect structures (e.g., the one or more solder balls 112) and the one or more thermal dissipation structures (e.g., the one or more solder balls 418) to the printed circuit board 150. According to various embodiments, the package assembly 400B is mounted on the printed circuit board 150 using a surface mount technology (SMT).

FIGS. 5A-5G schematically illustrate the package assembly 300A of FIG. 3A subsequent to various process operations. Although the package assembly 300A is used as an example to illustrate the principles of these embodiments, the principles can be suitably applied to other package assemblies described herein.

Figure 5A:
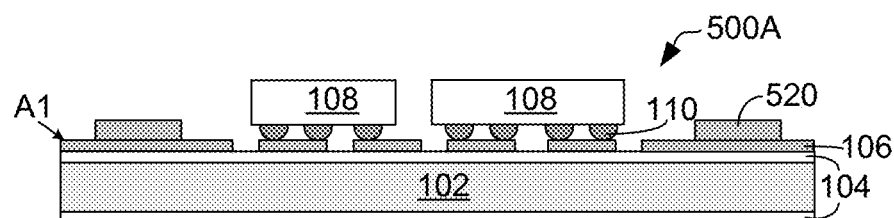
FIGS. 5A-5G schematically illustrate the package assembly of FIG. 3A subsequent to various process operations.

Referring to FIG. 5A, a package assembly 500A is depicted subsequent to forming one or more package interconnect structures (e.g., one or more bumps 520) on the one or more interconnect layers 106. The one or more bumps 520 can be formed, for example, by printing, plating, or placing the one or more bumps 520 on the one or more interconnect layers 106 of the semiconductor substrate 102. The one or more bumps 520 can be reflowed to form a circular shape, but is not limited to the circular shape. In other embodiments, the one or more bumps 520 can have other shapes such as a planar shape. The one or more bumps 520 can be formed using any suitable electrically conductive material such as, for example, lead, gold, tin, copper, or lead-free materials, or combinations thereof.

The one or more package interconnect structures can include other types of structures than the one or more bumps 520 depicted in FIG. 5A. For example, the one or more package interconnect structures can include solder balls (e.g., the solder balls 112 of FIG. 1) in other embodiments.

Figure 5B:
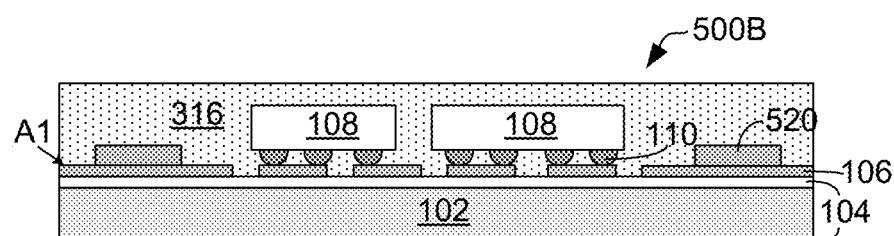

Referring to FIG. 5B, a package assembly 500B is depicted subsequent to depositing a molding compound 316 to substantially fill a region between the one or more semiconductor dies 108 and the semiconductor substrate 102. Filling this region with molding compound 316 may save cost and process steps associated with fabrication of the semiconductor substrate 102. Generally, underfill material (e.g., the underfill material 314 of FIG. 3C) is more costly than the molding compound 316.

The molding compound 316 is further deposited to substantially encapsulate the one or more semiconductor dies 108. In some embodiments, the molding compound 316 is deposited to substantially cover a surface on the first side A1 of the semiconductor substrate 102, which can be in either wafer form or singulated form. When the semiconductor substrate 102 is in wafer form, the molding compound 316 can be deposited to overmold an entire surface of the wafer corresponding with the first side A1 of the semiconductor substrate 102. The deposited molding compound 316 can be further divided into smaller blocks or regions for stress/warpage control. For example, portions of the molding compound 316 can be patterned using well-known etch and/or lithography processes or otherwise removed at peripheral edges of each semiconductor substrate unit on the wafer.

Figure 5C:
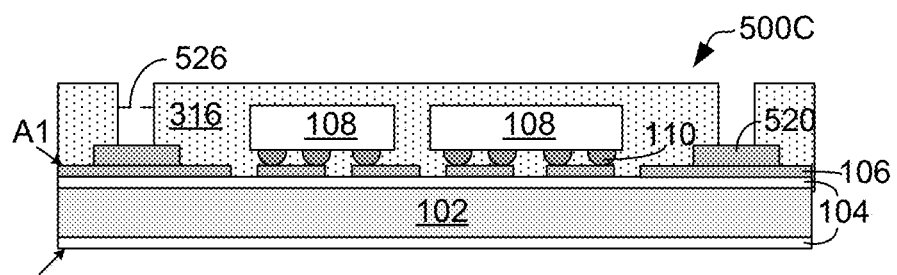

Referring to FIG. 5C, a package assembly 500C is depicted subsequent to forming one or more openings 526 in the molding compound 316. According to various embodiments, the one or more openings 526 are formed to expose the one or more package interconnect structures (e.g., the one or more bumps 520). The one or more openings 526 can be formed using a laser ablation or etching process. In these embodiments, the one or more package interconnect structures provide an etch stop or laser stop material during formation of the one or more openings 526.

Figure 5D:
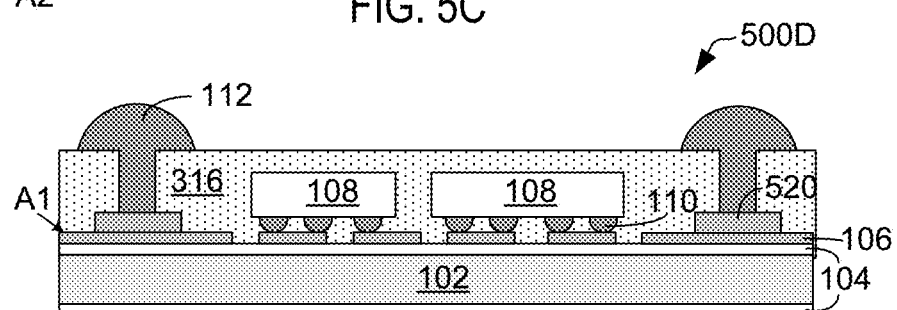

Referring to FIG. 5D, a package assembly 500D is depicted subsequent to depositing an electrically conductive material (e.g., one or more solder balls 112) to substantially fill the one or more openings (e.g., the one or more openings 526 of FIG. 5C). In the depicted embodiment, one or more solder balls 112 are electrically coupled to the one or more bumps 520, which are electrically coupled to the one or more interconnect layers 106. The one or more solder balls 112 can, for example, be placed and reflowed to provide package interconnect structures for the package assembly 500D. That is, the package interconnect structures can include the one or more solder balls 112 and the one or more bumps 520, coupled as shown.

In other embodiments, the one or more solder balls 112 are formed directly on the one or more interconnect layers 106. That is, in some embodiments, the one or more bumps 520 are not be formed at all and the one or more solder balls 112 are directly bonded to the one or more interconnect layers 106 through the one or more openings.

When the one or more bumps 520 are used in conjunction with the one or more solder balls 112, as depicted, the one or more solder balls 112 can be smaller than solder balls that are used in a package assembly that does not use the one or more bumps 520. The additional height provided by the one or more bumps 520 facilitates using a smaller size for the one or more solder balls 112 because less solder ball material is needed to fill the one or more openings.

The one or more solder balls 112 can include multiple rows of solder balls configured to further route the electrical signals of the one or more semiconductor dies 108. The package interconnect structures can include other types of structures.

For example, in some embodiments, one or more post structures are formed in the one or more openings to route the electrical signals of the one or more semiconductor dies 108.

In some embodiments, the package interconnect structures (e.g., the one or more solder balls 112) are attached to a printed circuit board (e.g., the printed circuit board 150 of FIG. 1). According to various embodiments, the package assembly 500D is a final package assembly.

In some embodiments, the semiconductor substrate 102 is in wafer form and a backside of the wafer (e.g., the second side A2 of the semiconductor substrate 102) is thinned to provide a smaller package assembly. Material can be removed from the backside of the wafer using, for example, well-known mechanical and/or chemical wafer-thinning processes such as grinding or etching.

Figure 5E:
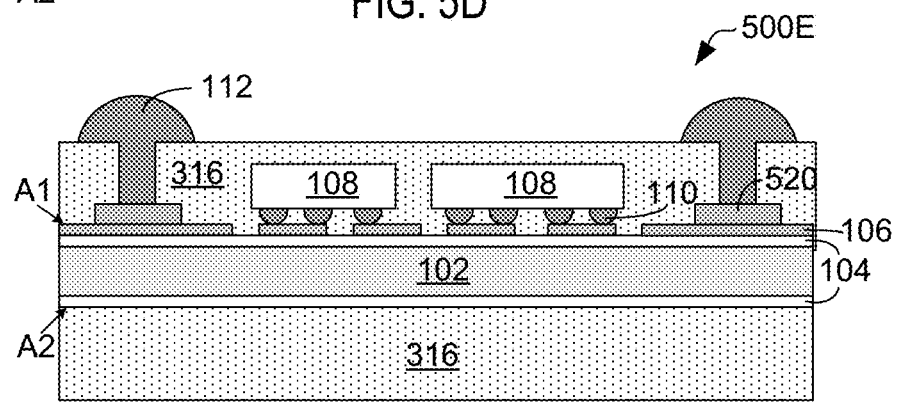

Referring to FIG. 5E, a package assembly 500E is depicted subsequent to forming a molding compound 316 to substantially cover the second side A2 of the semiconductor substrate 102. The molding compound 316 disposed on the second side A2 can be used, for example, to counterbalance stress associated with the molding compound 316 disposed on the first side A1 of the semiconductor substrate 102 and, thus, reduce stress and/or warpage for the package assembly 500E. In some embodiments, the molding compound 316 is deposited on the second side A2 of the semiconductor substrate 102 when the semiconductor substrate 102 is in wafer form, prior to singulation. In some embodiments, the package assembly 500E is a final package assembly.

Figure 5F:
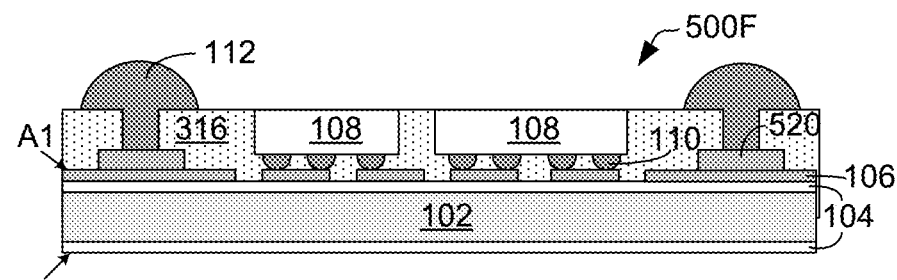

Referring to FIG. 5F, a package assembly 500F is depicted to show that, in some embodiments, the molding compound 316 is formed on the first side A1 of the semiconductor substrate 102 to have a surface that is substantially coplanar with or lower than an inactive side of the one or more semiconductor dies 108. In an embodiment, the package assembly 500F is formed by removing material of the molding compound 316 of the package assembly 500B of FIG. 5B to expose the one or more semiconductor dies 108. The material can be removed, for example, by a polishing process. In another embodiment, the molding compound 316 of the package assembly 500F is formed by using a mold that is configured to provide a surface of the molding compound 316 that is substantially coplanar with or lower than the inactive side of the one or more semiconductor dies 108. In some embodiments, the package assembly 500F is a final package assembly.

Figure 5G:
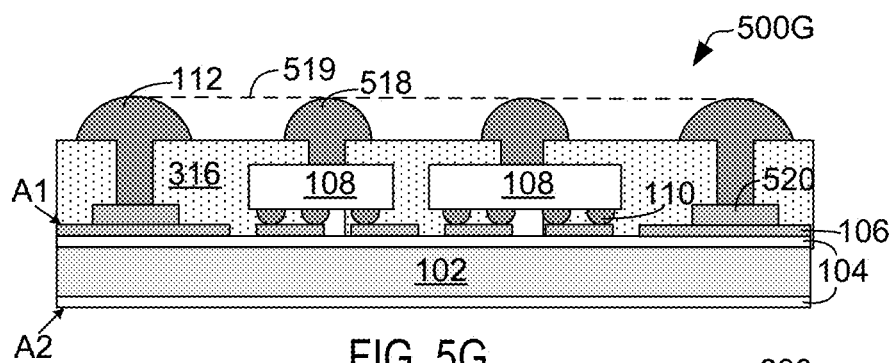

Referring to FIG. 5G, a package assembly 500G is depicted subsequent to the formation of one or more thermal dissipation structures (e.g., solder balls 518) on an inactive side of the one or more semiconductor dies 108, as shown. The one or more thermal dissipation structures generally comprise a thermally conductive material such as, for example, metal (e.g., solder) to provide a thermal path for heat dissipation. The one or more package interconnect structures (e.g., the one or more solder balls 112) and the one or more thermal dissipation structures (e.g., the solder balls 518) can be sized to have surfaces that are substantially coplanar, as can be seen. For example, the solder balls 112 and the solder balls 518 can be sized to have a surface that substantially lies in the same plane 519 to facilitate connection to a substantially planar surface such as a printed circuit board (e.g., the printed circuit board 150 of FIG. 4B). In some embodiments, the solder balls 112 are larger in size than the solder balls 518, as depicted. The solder balls 112, 518 can be formed such that they have surfaces that do not lie in the same plane 519 in other embodiments.

The one or more solder balls 518 can be formed, for example, by forming one or more openings in the molding compound 316 of the package assembly 500B of FIG. 5B or the package assembly 500D of FIG. 5D to expose the inactive side of the one or more semiconductor dies 108. The one or more openings can be formed using a laser ablation or etching process. The inactive side of the one or more semiconductor dies 108 can function as a laser stop or etch stop material. Subsequent to formation of the one or more openings, the one or more solder balls 518 can be deposited to substantially fill the one or more openings over the one or more semiconductor dies 108. In some embodiments, the package assembly 500G is a final package assembly.

Figure 6:
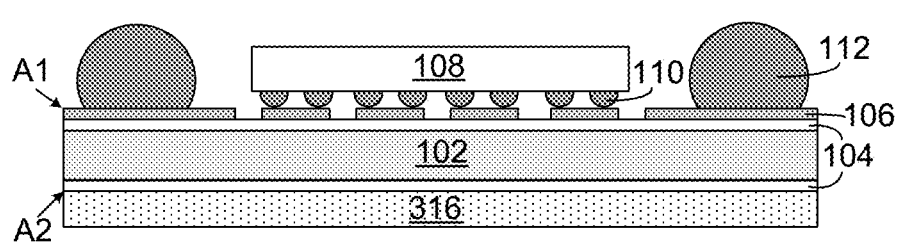
FIGS. 6-11 schematically illustrate various package assembly configurations using a semiconductor substrate.

FIGS. 6-11 schematically illustrate various package assembly configurations using a semiconductor substrate 102. Referring to FIG. 6, a package assembly 600 is depicted subsequent to formation of a molding compound 316 on the second side A2 of the semiconductor substrate 102. The molding compound 316 can be deposited to substantially cover the second side A2 of the semiconductor substrate 102. The molding compound 316 can be formed to protect or strengthen the semiconductor substrate 102. For example, the molding compound 316 can be formed prior to attaching the one or more semiconductor dies 108 to the semiconductor substrate 102 to protect the semiconductor substrate 102 from chipping or other damage that can occur while handling the semiconductor substrate 102 during package assembly actions described herein. In some embodiments, the molding compound 316 is deposited on the second side A2 of the semiconductor substrate 102 when the semiconductor substrate 102 is in wafer form, prior to singulation.

Figure 7:
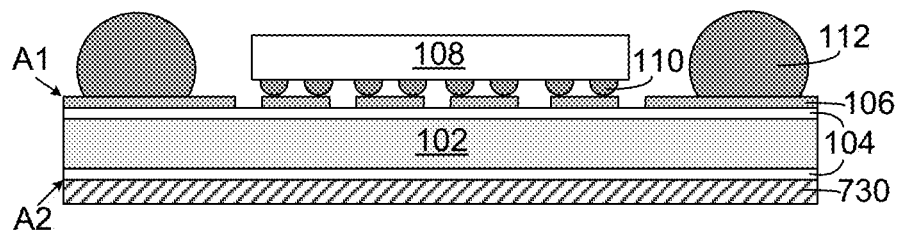

Referring to FIG. 7, a package assembly 700 is depicted subsequent to attachment of a heat spreader 730 to the second side A2 of the semiconductor substrate 102. The heat spreader 730 includes a structure that facilitates heat removal such as a metal plate. The heat spreader 730 can be thermally coupled to the second side A2 of the semiconductor substrate 102 using a thermally conductive adhesive. The heat spreader 730 can be attached when the semiconductor substrate 102 is in either wafer form or singulated form. In other embodiments, the heat spreader 703 can be formed using deposition processes similar to those used to form the one or more interconnect layers 106.

Figure 8:
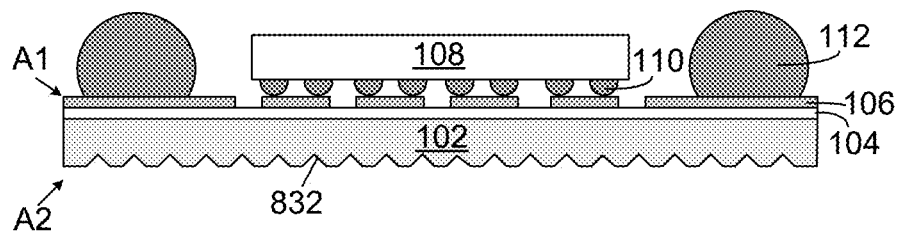

Referring to FIG. 8, a package assembly 800 is depicted subsequent to removing portions of the semiconductor material from the second side A2 of the semiconductor substrate 102 to increase a surface area for improved heat dissipation. According to various embodiments, one or more recessed regions 832, such as holes or channels, are formed in a surface on the second side A2 of the semiconductor substrate 102. The one or more recessed regions 832 can be formed according to any suitable technique including, for example, an etching process. A profile of the one or more recessed regions 832 can have other shapes than depicted in other embodiments. A thermally conductive layer (not shown) such as a metal layer can be deposited on the surface having the one or more recessed regions 832 to increase thermal dissipation.

Figure 9A:
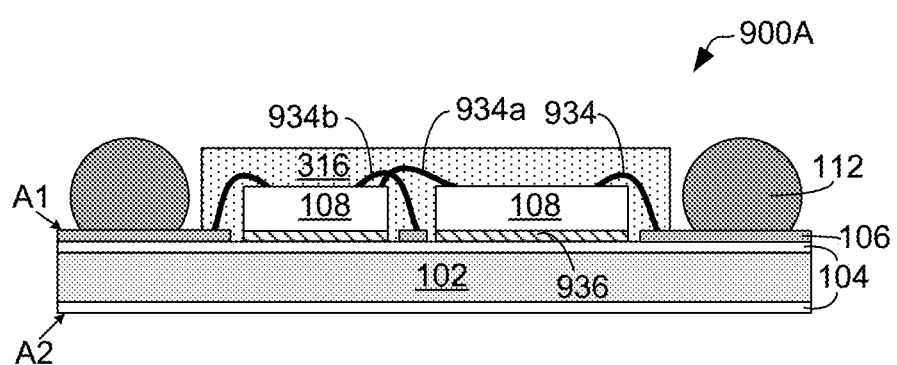

Referring to FIG. 9A, a package assembly 900A includes one or more semiconductor dies 108 attached to the semiconductor substrate 102 in a wire-bonding configuration. An inactive side of the one or more semiconductor dies 108 is attached to the first side A1 of the semiconductor substrate 102 using an adhesive and an active side of the one or more semiconductor dies is electrically coupled to the one or more interconnect layers 106 using one or more bonding wires 934. The adhesive can include any suitable die attach material such as an epoxy. The one or more bonding wires 934 generally comprise an electrically conductive material, such as a metal, to route the electrical signals of the one or more semiconductor dies 108. The one or more bonding wires 934 can be formed using, for example, a ball-bonding or wedge-bonding process.

In an embodiment, a bonding wire 934a is formed to electrically couple an active side of a first semiconductor die to an active side of a second semiconductor die, as shown. The one or more bonding wires 934 can further include a bonding wire 934b that electrically couples an active side of a semiconductor die to the one or more interconnect layers 106 disposed between the first semiconductor die and the second semiconductor die. A molding compound 316 is formed to substantially encapsulate the one or more semiconductor dies 108 and the one or more bonding wires 934, as shown.

Figure 9B:
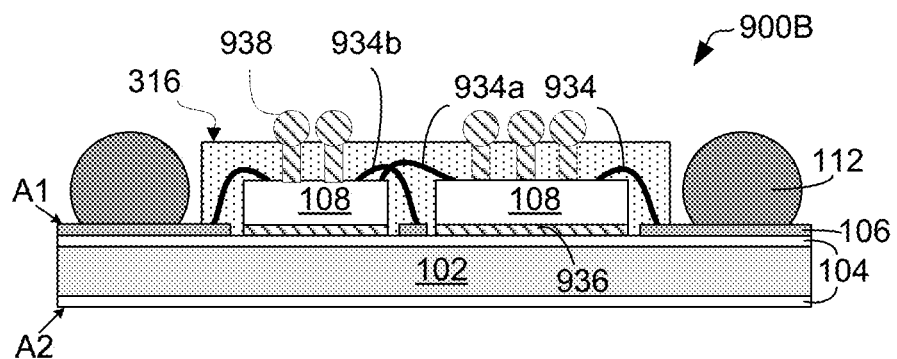

FIG. 9B illustrates a package assembly 900B that is similar to the package assembly 900A as shown in FIG. 9A. In the package assembly 900B, vias 938, such as through-silicon vias, that are filled with conducting materials are used to provide electrical connections from the semiconductor dies 108 to external components. These vias 938 may be used to provide power and ground connections.

Figure 10A:
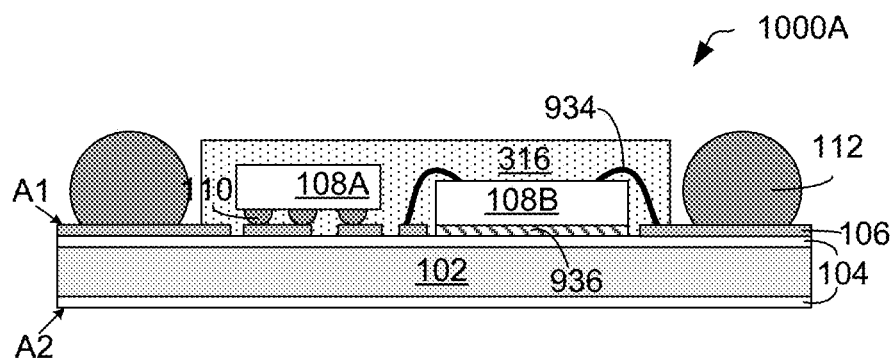

Referring to FIG. 10A, a package assembly 1000A includes one or more semiconductor dies 108A,B attached to the semiconductor substrate 102 in a mixed flip-chip and wire-bonding configuration. For example, a first semiconductor die of the one or more semiconductor dies 108A,B is attached to the semiconductor substrate 102 in a flip-chip configuration using one or more bumps 110 and a second semiconductor die of the one or more semiconductor dies 108A,B is attached to the semiconductor substrate 102 in a wire-bonding configuration using one or more bonding wires 934. A molding compound 316 is formed to substantially encapsulate the one or more semiconductor dies 108A,B and the one or more bonding wires 934, as shown.

Figure 10B:
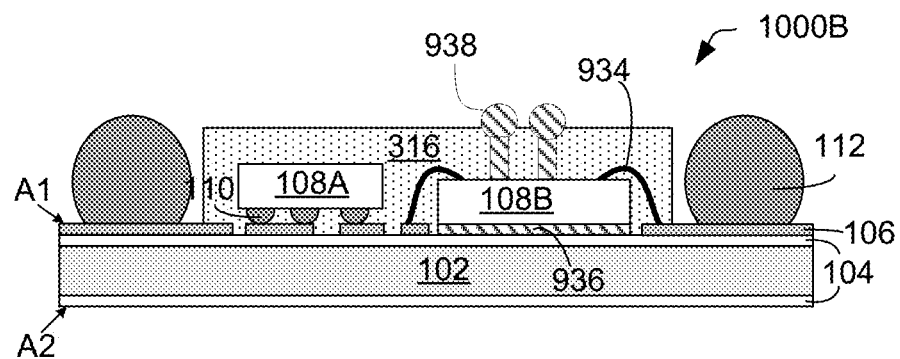

FIG. 10B illustrates a package assembly 1000B that is similar to the package assembly 1000A as shown in FIG. 10A. In the package assembly 1000B, vias 938, such as through-silicon vias, that are filled with conducting materials are used to provide electrical connections from the semiconductor die 108B to external components. These vias 938 may be used to provide power and ground connections.

Figure 11:
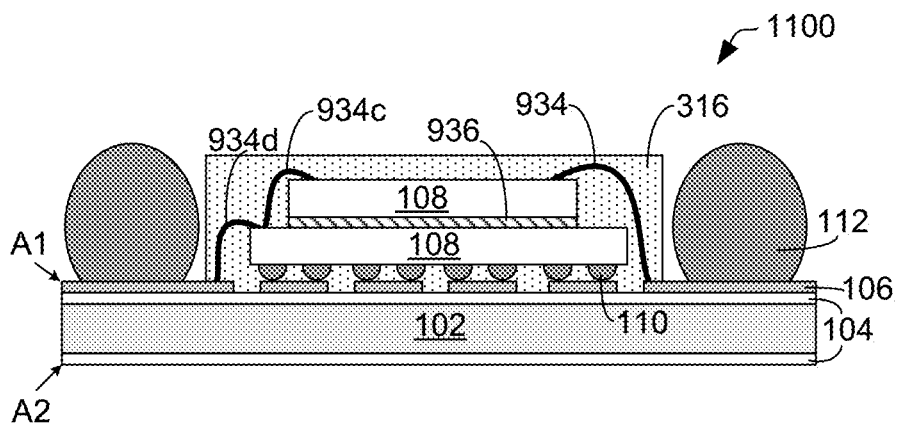

Referring to FIG. 11, a package assembly 1100 includes one or more semiconductor dies 108 attached to the semiconductor substrate 102 in a stacked flip-chip and wire-bonding configuration. A first semiconductor die of the one or more semiconductor dies 108 is attached to the semiconductor substrate 102 in a flip-chip configuration. An active side of the first semiconductor die is electrically coupled to the one or more interconnect layers 106 using one or more bumps 110, as shown. An inactive side of a second semiconductor die of the one or more semiconductor dies 108 is attached to first semiconductor die using an adhesive 936, as shown. In some embodiments, a spacer (not shown) such as dummy silicon can be positioned between the first and second semiconductor dies. An active side of the second semiconductor die is electrically coupled to the one or more interconnect layers 106 using one or more bonding wires 934. In other embodiments, vias (not shown), such as through-silicon vias, that are filled with conducting materials may be used to couple the active side of the second semiconductor die to external components through the molding compound 316. The vias may be used to provide power and ground connections.

In some embodiments, the active side of the second semiconductor die is electrically coupled to the one or more interconnect layers 106 by using a bonding wire 934c to electrically couple the active side of the second semiconductor die to the inactive side of the first semiconductor die and using a bonding wire 934d to electrically couple the first bonding wire 934c to the one or more interconnect layers 106. A molding compound 316 is formed to substantially encapsulate the one or more semiconductor dies 108 and the one or more bonding wires 934, as shown. Although not shown, in other embodiments, a bottom semiconductor die of the one or more semiconductor dies 108 can be coupled to the semiconductor substrate 102 in a wirebonding configuration and a top semiconductor die of the one or more semiconductor dies 108 can be coupled to the bottom semiconductor die in a flip-chip configuration.

Techniques and configurations described in connection with FIGS. 6-11 can be suitably combined with other embodiments described herein. For example, in some embodiments, the techniques and configurations described for the package assemblies of FIGS. 6-8 can be performed on the package assemblies of FIG. 1, FIGS. 3A-3D, FIGS. 4A-4B, FIGS. 5A-5G, or FIGS. 9-11. In some embodiments, the techniques and configurations described for the package assemblies of FIGS. 9-11 can be performed, for example, on the package assemblies of FIG. 1, FIGS. 3A-3D, FIGS. 4A-4B, FIGS. 5A-5G, or FIGS. 6-8. Other suitable combinations of the techniques and configurations described herein can be used in other embodiments.

Figure 12:
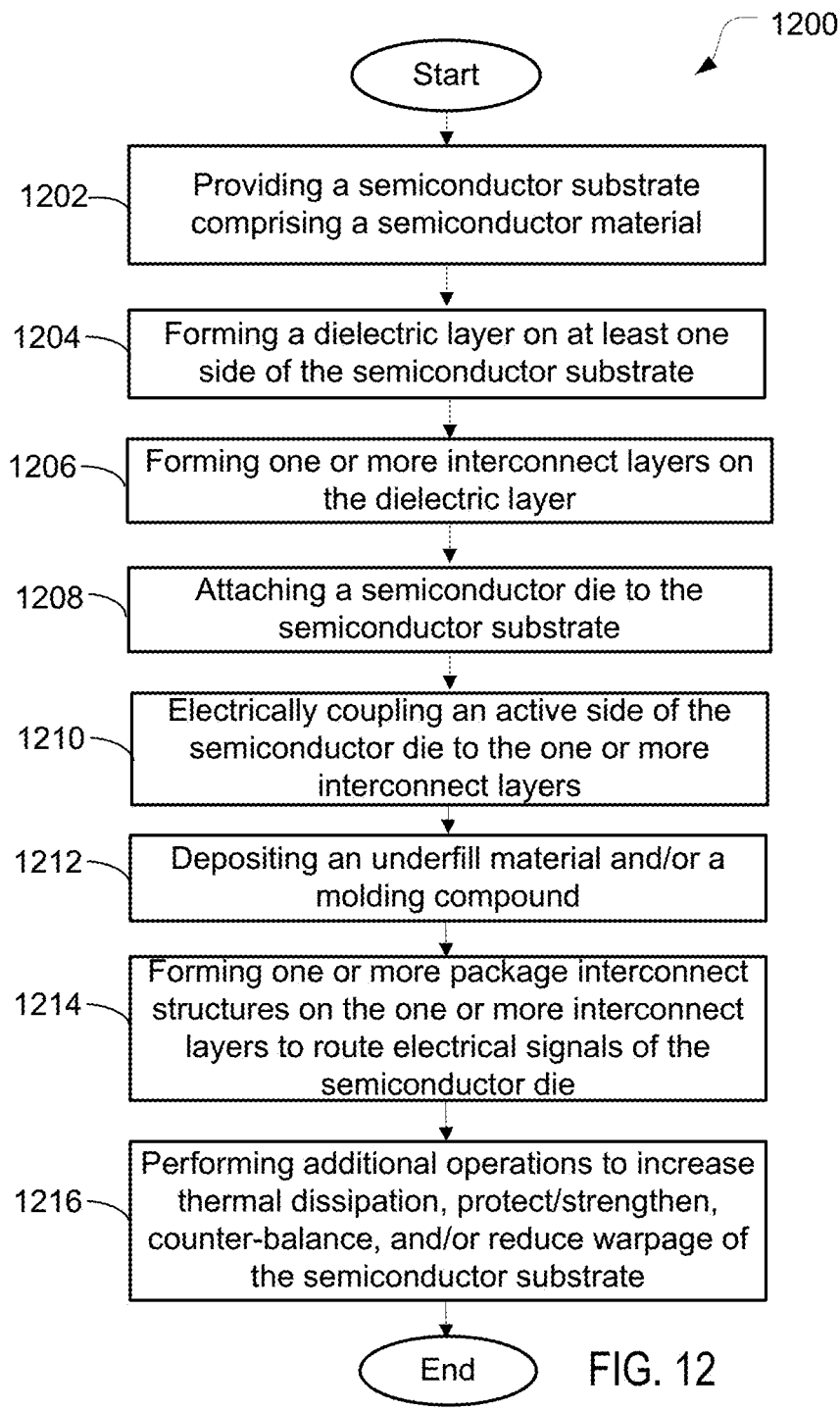
FIG. 12 is a process flow diagram of a method to fabricate a package assembly using a semiconductor substrate.

FIG. 12 is a process flow diagram of a method 1200 to fabricate a package assembly (e.g., the package assembly 100 of FIG. 1) using a semiconductor substrate (e.g., the semiconductor substrate 102 of FIG. 1). At 1202, the method 1200 includes providing a semiconductor substrate comprising a semiconductor material. The semiconductor substrate generally has a first side (e.g., the first side A1 of FIG. 2A) and a second side (e.g., the second side A2 of FIG. 2A) that is disposed opposite to the first side. In some embodiments, one or more devices are formed on the first side (e.g., the first side A1 of FIG. 1) of the semiconductor substrate prior to attaching the semiconductor die to the semiconductor substrate. For example, a capacitor (e.g., the capacitor 222 of FIG. 2C) or an ESD protection device (e.g., the ESD protection device 224 of FIG. 2C) can be formed on the first side of the semiconductor substrate. The one or more devices can be formed using techniques described in connection with FIG. 2C and further described in connection with 1204 and 1206 of method 1200.

At 1204, the method 1200 further includes forming a dielectric layer (e.g., the dielectric layer 104 of FIG. 1) on at least one side (e.g., the first side A1) of the semiconductor substrate. The dielectric layer can further be formed on the opposite side (e.g., the second side A2) of the semiconductor substrate in some embodiments.

The dielectric layer 104 can be formed by depositing an electrically insulative material such as, for example, silicon dioxide ($SiO_2$), silicon nitride (SiN), or silicon oxynitride ($SiO_xN_y$) to substantially cover one or more surfaces of the semiconductor substrate 102, as shown. Other suitable electrically insulative materials can be used in other embodiments.

The dielectric layer 104 can be formed by using a suitable deposition technique including, for example, physical vapor deposition (PVD), chemical vapor deposition (CVD), and/or atomic layer deposition (ALD). Other suitable deposition techniques can be used in other embodiments. The dielectric layer 104 can be used as a dielectric (e.g., gate dielectric) in the formation of the one or more devices (e.g., capacitor 222 or ESD protection device 224 of FIG. 2C) on the semiconductor substrate 102.

At 1206, the method 1200 further includes forming one or more interconnect layers (e.g., the one or more interconnect layers 106 of FIG. 1) on the dielectric layer on the first side of the semiconductor substrate. The one or more interconnect layers can be used to route electrical signals such as, for example, input/output (I/O) signals and/or power/ground signals, to and/or from one or more semiconductor dies (e.g., the one or more semiconductor dies 108 of FIG. 1).

The one or more interconnect layers can be formed by depositing and/or patterning an electrically conductive material such as, for example, a metal (e.g., copper or aluminum) or a doped semiconductor material (e.g., doped polysilicon). Other suitable electrically conductive materials can be used in other embodiments.

The one or more interconnect layers can include a variety of structures to route the electrical signals such as, for example, pads, lands, or traces. A passivation layer comprising an electrically insulative material such as, for example, polyimide can be deposited on the one or more interconnect layers and patterned to provide openings in the passivation layer to facilitate electrical coupling of the one or more semiconductor dies to the one or more interconnect layers.

The one or more interconnect layers can be used as an electrode material in the formation of the one or more devices on the semiconductor substrate. For example, the electrode material can serve as a gate electrode for the one or more devices.

At 1208, the method 1200 further includes attaching a semiconductor die (e.g., the one or more semiconductor dies 108 of FIG. 1) to the semiconductor substrate. As described herein, one or more semiconductor dies can be attached to the first side of the semiconductor substrate in a variety of configurations.

In an embodiment, the semiconductor die is attached to the first side of the semiconductor substrate in a flip-chip configuration (e.g., as shown in the package assembly 100 of FIG. 1). In the flip-chip configuration, the active side of the semiconductor die is generally attached to the first side of the semiconductor substrate using one or more bumps (e.g., the one or more bumps 110 of FIG. 1).

In another embodiment, the semiconductor die is attached to the first side of the semiconductor substrate in a wire-bonding configuration (e.g., as shown in the package assembly 900 of FIG. 9). In the wire-bonding configuration, an inactive side of the semiconductor die is attached to the first side of the semiconductor using an adhesive.

In yet another embodiment, the semiconductor die is attached to the semiconductor substrate in a flip-chip configuration and another semiconductor die is attached to the semiconductor substrate in a wire-bonding configuration (e.g., as shown in the package assembly 1000 of FIG. 10). In still yet another embodiment, an active side of the semiconductor die is attached to the first side of the semiconductor substrate in a flip-chip configuration and an inactive side of another semiconductor die is attached to the semiconductor die using an adhesive (e.g., as shown in the package assembly 1100 of FIG. 11).

At 1210, the method 1200 further includes electrically coupling the active side of the semiconductor die to the one or more interconnect layers. In an embodiment, the active side of the semiconductor die is electrically coupled to the one or more interconnect layers using the one or more bumps. In another embodiment, the active side of the semiconductor die is electrically coupled to the one or more interconnect layers using one or more bonding wires (e.g., the one or more bonding wires 934 of FIG. 9). Combinations of these techniques can be used in other embodiments.

At 1212, the method 1200 further includes depositing an underfill material (e.g., the underfill material 314 of FIG. 3B) and/or a molding compound (e.g., the molding compound 316 of FIG. 3C, 5B, or 9). The underfill material is generally deposited to substantially fill a region between the semiconductor die and the semiconductor substrate. According to various embodiments, the underfill material is deposited in liquid form by a liquid dispensing or injection process. The underfill material can include, for example, an epoxy or other suitable electrically insulative material.

The molding compound is generally deposited to substantially encapsulate the semiconductor die. In a wire-bonding configuration, the molding compound is deposited to substantially encapsulate the one or more bonding wires. According to various embodiments, the molding compound is formed by depositing a resin (e.g., a thermosetting resin) in solid form (e.g., a powder) into a mold and applying heat and/or pressure to fuse the resin. In some embodiments, the molding compound is not the same material as the underfill material.

In a flip-chip configuration, the molding compound can be used in conjunction with the underfill material (e.g., as shown in FIG. 3C). In other embodiments of the flip-chip configuration, the molding compound can be deposited to fill the underfill region. That is, in some embodiments, the underfill material is not used and the molding compound is deposited to substantially fill a region between the semiconductor die and the semiconductor substrate (e.g., as shown in FIG. 5B). In some embodiments, the molding compound is formed to cover only a portion of the first side of the semiconductor substrate (e.g., as shown in FIG. 3C). In other embodiments, the molding compound is formed to substantially cover the entire first side of the semiconductor substrate (e.g., as shown in FIG. 5B).

At 1214, the method 1200 further includes forming one or more package interconnect structures on the one or more interconnect layers to route electrical signals of the semiconductor die to and/or from the semiconductor substrate. In some embodiments, the one or more package interconnect structures include one or more solder balls (e.g., the one or more solder balls 112 of FIG. 3D or 5D). The one or more solder balls can be formed, for example, by printing, plating, or placing the one or more solder balls on the one or more interconnect layers of the semiconductor substrate. A reflow process can be used to form a connection between the one or more solder balls and the one or more interconnect layers. In some embodiments, the one or more solder balls can be attached or electrically coupled to the one or more interconnect layers through one or more openings (e.g., the one or more openings 526 of FIG. 5C) formed in the molding compound as described herein.

In some embodiments, the one or more package interconnect structures include one or more bumps (e.g., the one or more bumps 520 of FIG. 5A). The one or more bumps can be formed, for example, by printing, plating, or placing the one or more bumps on the one or more interconnect layers of the semiconductor substrate. The one or more bumps can be reflowed to form a circular shape. The one or more bumps can have other shapes such as a planar shape. The one or more bumps can be formed using any suitable electrically conductive material such as, for example, lead, gold, tin, copper, or lead-free materials, or combinations thereof. The one or more package interconnect structures can include combinations of the one or more bumps and the one or more solder balls (e.g., as shown in FIG. 5D). The one or more package interconnect structures can be electrically coupled to a printed circuit board (e.g., the printed circuit board 150 of FIG. 1).

At 1216, the method 1200 further includes performing additional operations to increase thermal dissipation, protect/strengthen, counter-balance, and/or reduce warpage of the semiconductor substrate. In some embodiments, one or more thermal dissipation structures (e.g., the one or more solder balls 418 or 518 of respective FIG. 4A or 5G) are formed on an inactive side of a semiconductor die to provide a thermal path for heat dissipation away from the semiconductor die, as described herein. The one or more thermal dissipation structures for heat dissipation can formed simultaneously as the one or more package interconnects and can be subsequently attached to a printed circuit board (e.g., the printed circuit board 150 of FIG. 4B) during a surface mount process to couple the one or more package interconnects to the printed circuit board.

In some embodiments, a heat spreader (e.g., the heat spreader 730 of FIG. 7) is thermally coupled to the second side of the substrate. The heat spreader can be attached, for example, by using a thermally conductive compound. In other embodiments, one or more recessed regions (e.g., the one or more recessed regions 832 of FIG. 8) are formed by removing portions of the semiconductor material from the second side of the semiconductor substrate to increase a surface area of the second side. The increased surface area facilitates heat removal away from the second side of the semiconductor substrate.

In an embodiment, a molding compound is formed to substantially cover the second side of the semiconductor substrate (e.g., as shown in FIG. 6). The molding compound can be used to strengthen and/or protect the semiconductor substrate against chipping or other environmental harm. In some embodiments, the molding compound is formed on the second side of the semiconductor substrate to counter-balance and/or prevent warpage associated with a molding compound formed on the first side of the semiconductor substrate (e.g., as shown in FIG. 5E). The actions described in connection with method 1200 can include other suitable embodiments for techniques described elsewhere in this description.

Figure 13:
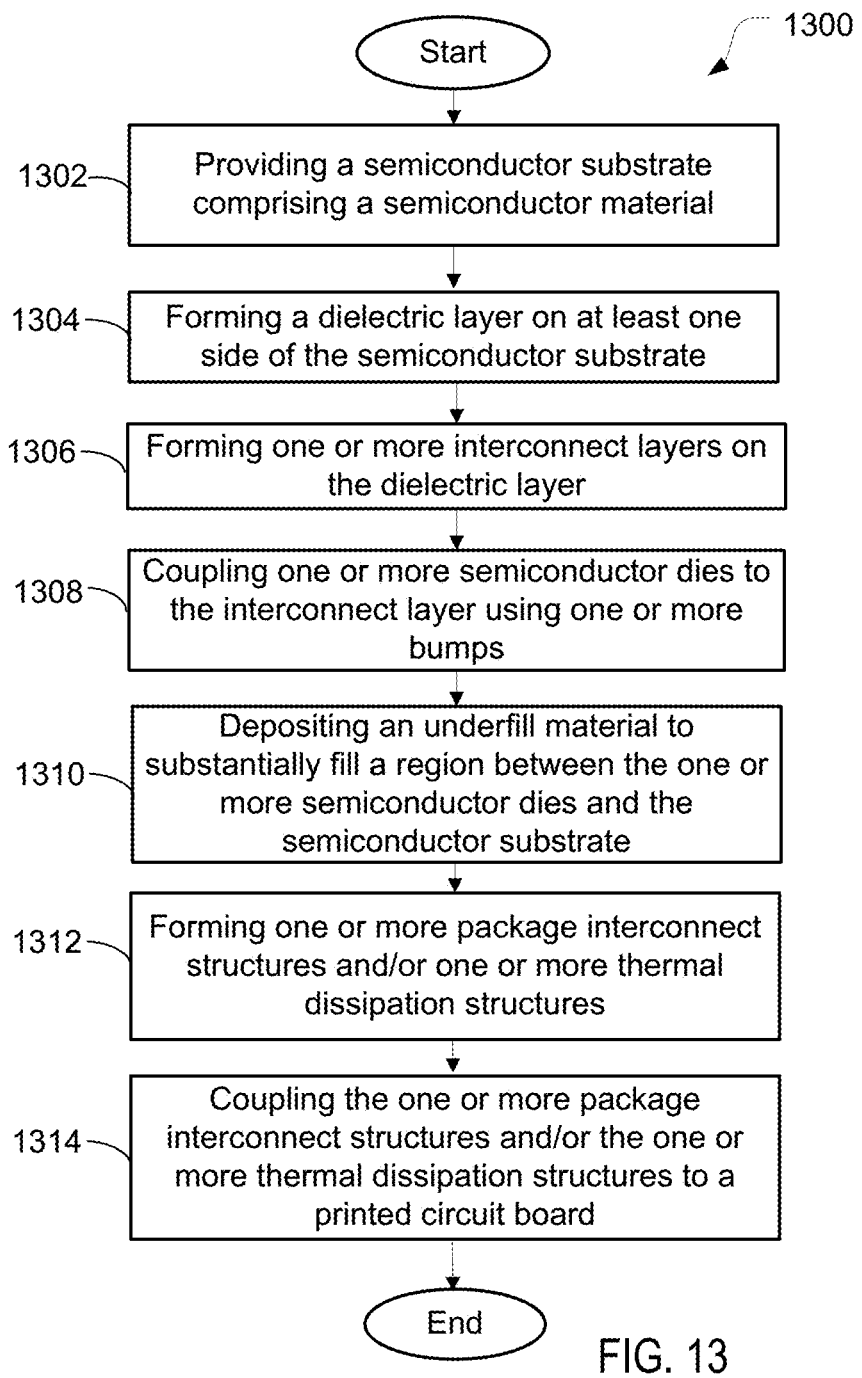
FIG. 13 is a process flow diagram of another method to fabricate a package assembly using a semiconductor substrate.

FIG. 13 is a process flow diagram of another method 1300 to fabricate a package assembly (e.g., the package assembly 400B of FIG. 4B) using a semiconductor substrate (e.g., the semiconductor substrate 102 of FIG. 4B). At 1302, 1304, and 1306, the method 1300 respectively includes providing a semiconductor substrate comprising a semiconductor material, forming a dielectric layer on at least one side of the semiconductor substrate, and forming one or more interconnect layers on the dielectric layer, which may comport with embodiments already described in connection with 1202, 1204, and 1206 of method 1200.

At 1308, the method 1300 further includes coupling one or more semiconductor dies (e.g., the semiconductor dies 108 of FIG. 3A) to the interconnect layer using one or more bumps (e.g., the one or more bumps 110 of FIG. 3A). The one or more semiconductor dies can be configured, for example, in a flip-chip configuration where an active side of the semiconductor die is coupled to the semiconductor substrate using the one or more bumps.

At 1310, the method 1300 further includes depositing an underfill material (e.g., the underfill material 314 of FIG. 3B) to substantially fill a region between the semiconductor die and the semiconductor substrate. According to various embodiments, the underfill material is deposited in liquid form by a liquid dispensing or injection process. A molding compound (e.g., the molding compound 316 of FIG. 3C) can also be formed to substantially encapsulate the one or more semiconductor dies. The underfill material and the molding compound generally comport with embodiments described herein.

At 1312, the method 1300 further includes forming one or more package interconnect structures (e.g., the solder balls 112 of FIG. 3D) and/or one or more thermal dissipation structures (e.g., the one or more solder balls 418 of FIG. 4A). The one or more package interconnect structures are electrically coupled to the one or more interconnect layers. In some embodiments, the one or more package interconnect structures are formed on the one or more interconnect layers. The one or more thermal dissipation structures are generally formed on an inactive side of the one or more semiconductor dies to provide a thermal path for heat dissipation. The one or more package interconnect structures and the one or more thermal dissipation structures can be sized to have respective surfaces that are substantially coplanar (e.g., plane 419 of FIG. 4A).

At 1314, the method 1300 further includes coupling the one or more package interconnect structures and/or the one or more thermal dissipation structures to a printed circuit board (e.g., the printed circuit board 150 of FIG. 4B). The printed circuit board can be a motherboard in some embodiments. The one or more package interconnect structures and/or the one or more thermal dissipation structures can be coupled to other electronic devices, such as another package assembly, in other embodiments.

Figure 14:
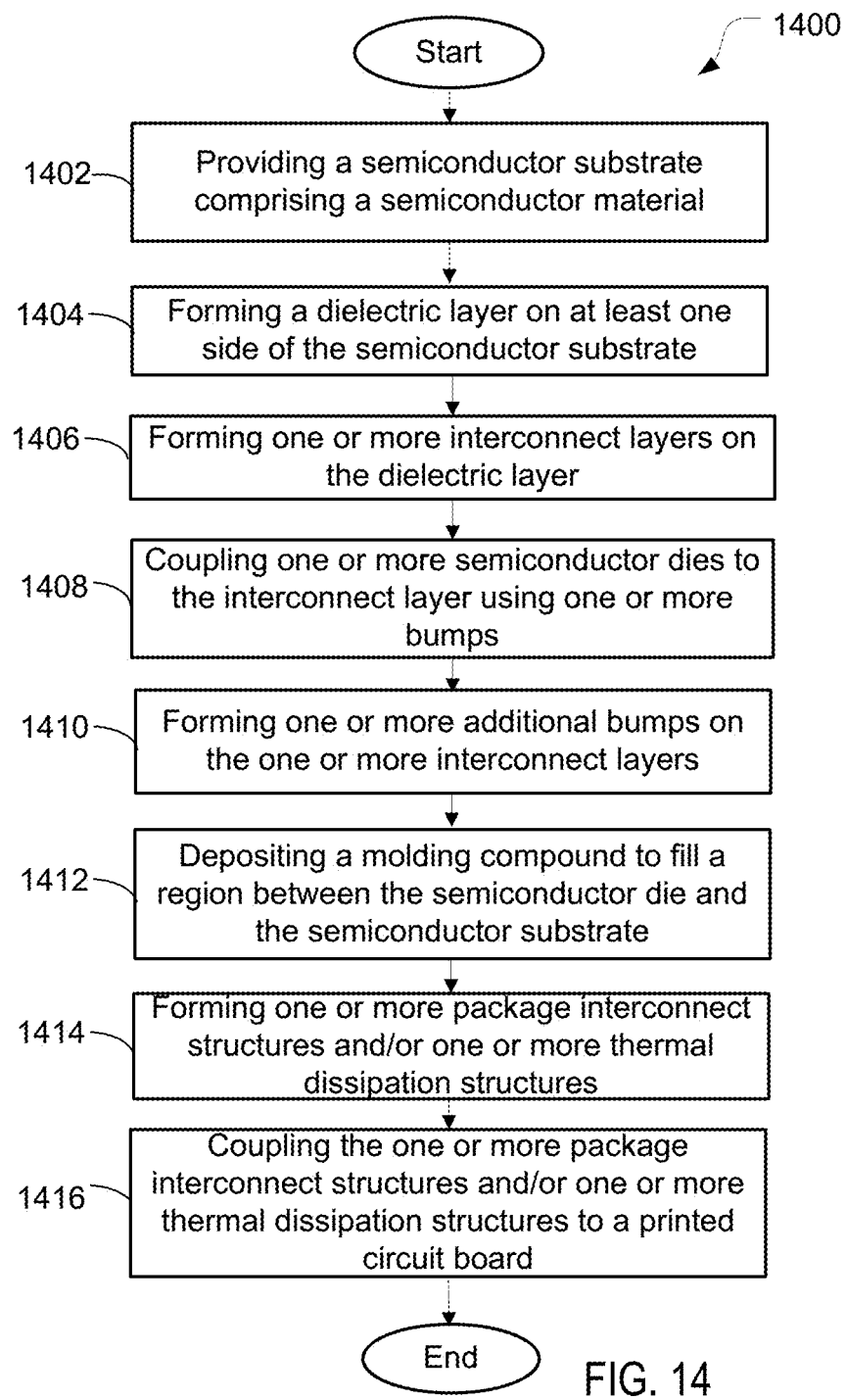
FIG. 14 is a process flow diagram of yet another method to fabricate a package assembly using a semiconductor substrate.

FIG. 14 is a process flow diagram of yet another method 1400 to fabricate a package assembly (e.g., the package assembly 500G of FIG. 5G) using a semiconductor substrate (e.g., the semiconductor substrate 102 of FIG. 5G). At 1402, 1404, and 1406, the method 1400 respectively includes providing a semiconductor substrate comprising a semiconductor material, forming a dielectric layer on at least one side of the semiconductor substrate, and forming one or more interconnect layers on the dielectric layer, which may comport with embodiments already described in connection with 1202, 1204, and 1206 of method 1200.

At 1408, the method 1400 further includes coupling one or more semiconductor dies (e.g., the semiconductor dies 108 of FIG. 5A) to the interconnect layer using one or more bumps (e.g., the one or more bumps 110 of FIG. 5A). The one or more semiconductor dies can be configured, for example, in a flip-chip configuration where an active side of the semiconductor die is coupled to the semiconductor substrate using the one or more bumps.

At 1410, the method 1400 further includes forming one or more additional bumps (e.g., the one or more bumps 520 of FIG. 5A) on the one or more interconnect layers in some embodiments. The one or more additional bumps are generally formed prior to the molding compound being deposited.

At 1412, the method 1400 further includes depositing a molding compound (e.g., the molding compound 316 of FIG. 5B) to fill a region between the semiconductor die and the semiconductor substrate. In some embodiments, the molding compound is deposited to substantially encapsulate the one or more semiconductor dies. A portion of the molding compound can be recessed by well-known mechanical and/or chemical processes to expose a surface of the one or more semiconductor dies.

The molding compound can be formed by depositing a resin of solid form into a mold and subsequently applying heat and/or pressure to fuse the resin. According to various embodiments, the molding compound is deposited when the semiconductor substrate is in wafer form to overmold an entire surface of the wafer. The deposited molding compound can be divided into smaller blocks or regions to reduce stress between the molding compound and the wafer.

In some embodiments where the semiconductor die is coupled to a first side of the semiconductor substrate, a molding compound is formed to substantially cover a second side of the semiconductor substrate, the second side being disposed opposite to the first side of the semiconductor substrate. The molding compound can be used in this manner to reduce stress and/or warpage associated with a molding compound disposed on the first side of the semiconductor substrate.

At 1414, the method 1400 further includes forming one or more package interconnect structures (e.g., the solder balls 112 of FIG. 5G) and/or one or more thermal dissipation structures (e.g., the one or more solder balls 518 of FIG. 5G). The one or more package interconnect structures are electrically coupled to the one or more interconnect layers. In some embodiments, the one or more package interconnect structures are formed on the one or more interconnect layers. In other embodiments where the one or more additional bumps (e.g., the one or more bumps 520 of FIG. 5D) are formed, the one or more package interconnect structures are formed on the one or more additional bumps. For example, one or more openings (e.g., the one or more openings 526 of FIG. 5C) can be formed in the molding compound using an etch or laser process to expose the one or more additional bumps. The one or more additional bumps can function as a laser or etch stop material. Subsequently, the one or more package interconnect structures can be formed on the exposed one or more additional bumps within the one or more openings.

The one or more thermal dissipation structures are generally formed on an inactive side of the one or more semiconductor dies to provide a thermal path for heat dissipation. One or more openings can be formed in the molding compound to expose the inactive side of the one or more semiconductor dies to allow formation of the one or more thermal dissipation structures on the one or more semiconductor dies. The one or more package interconnect structures and the one or more thermal dissipation structures can be sized to have respective surfaces that are substantially coplanar (e.g., plane 519 of FIG. 5G). The semiconductor substrate can be subsequently thinned by grinding or etching processes.

At 1416, the method 1400 further includes coupling the one or more package interconnect structures and/or the one or more thermal dissipation structures to a printed circuit board (e.g., the printed circuit board 150 of FIG. 4B). The printed circuit board can be a motherboard in some embodiments. The one or more package interconnect structures and/or the one or more thermal dissipation structures can be coupled to other electronic devices, such as another package assembly, in other embodiments.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A method comprising:
   forming an interconnect layer on a first substrate;
   attaching an active side of a semiconductor die to the interconnect layer using a first bump;
   attaching a package interconnect structure to the interconnect layer;
   attaching the package interconnect structure to a second substrate such that
   (i) the interconnect layer is attached to the second substrate via the package interconnect structure, and
   (ii) the semiconductor die is disposed between the first substrate and the second substrate, wherein the active side of the semiconductor die faces the first substrate and an inactive side of the semiconductor die faces the second substrate, and wherein the package interconnect structure is a structure configured to interconnect the interconnect layer and the second substrate; and forming, on the inactive side of the semiconductor die, (i) a first heat dissipation structure and (ii) a second heat dissipation structure, wherein the first heat dissipation structure and the second heat dissipation structure are physically separate and distinct from each other.

2. The method of claim 1, further comprising:
prior to attaching the package interconnect structure to the interconnect layer,
(i) forming a second bump on the interconnect layer,
(ii) depositing a molding compound on the interconnect layer such that the molding compound is deposited on the second bump, and
(iii) forming an opening in the molding compound over the second bump such that the second bump is exposed through the opening,
wherein attaching the package interconnect structure to the interconnect layer comprises
forming the package interconnect structure through the opening in the molding compound such that the package interconnect structure is attached to the interconnect layer via the second bump.

3. The method of claim 1, wherein:
the first heat dissipation structure comprises a first solder ball; and
the second heat dissipation structure comprises a second solder ball.

4. The method of claim 1, wherein:
the package interconnect structure has (i) a first end that is attached to the interconnect layer and (ii) a second end that is opposite to the first end;
the first heat dissipation structure has (i) a first end that is attached to the inactive side of the semiconductor die and (ii) a second end that is opposite to the first end;
the second heat dissipation structure has (i) a first end that is attached to the inactive side of the semiconductor die and (ii) a second end that is opposite to the first end; and
prior to attaching the package interconnect structure to the second substrate, each of (i) the second end of the package interconnect structure, (ii) the second end of the first heat dissipation structure, and (iii) the second end of the second heat dissipation structure substantially lie in the same plane.

5. The method of claim 1, further comprising:
attaching each of the first heat dissipation structure and the second heat dissipation structure to the second substrate.

6. The method of claim 1, further comprising:
prior to forming the first heat dissipation structure on the inactive side of the semiconductor die,
(i) depositing a molding compound such that the molding compound encapsulates at least the inactive side of the semiconductor die, and
(ii) forming an opening in the molding compound such that a first section of the inactive side of the semiconductor die is exposed through the opening,
wherein forming the first heat dissipation structure on the inactive side of the semiconductor die comprises
forming the first heat dissipation structure through the opening in the molding compound such that the first heat dissipation structure is attached to the first section of the inactive side of the semiconductor die.

7. The method of claim 1, wherein forming the interconnect layer on the first substrate comprises:

forming a dielectric layer on the first substrate; and
forming the interconnect layer on the dielectric layer.

8. The method of claim 1, wherein the second substrate is a printed circuit board.

9. The method of claim 1, wherein the semiconductor die is a first semiconductor die, the method further comprising:
attaching a second semiconductor die to the interconnect layer using a second bump.

10. An apparatus comprising:
a first substrate;
an interconnect layer formed on the first substrate;
a semiconductor die, wherein an active side of the semiconductor die is attached to the interconnect layer;
a package interconnect structure attached to the interconnect layer;
a second substrate, wherein the package interconnect structure is configured to be attached to the second substrate such that (i) the interconnect layer is attached to the second substrate via the package interconnect structure and (ii) the semiconductor die is disposed between the first substrate and the second substrate;
a first heat dissipation structure formed on an inactive side of the semiconductor die; and
a second heat dissipation structure formed on the inactive side of the semiconductor die, wherein the first heat dissipation structure and the second heat dissipation structure are physically separate and distinct from each other.

11. The apparatus of claim 10, further comprising:
a molding compound deposited on the interconnect layer, wherein the package interconnect structure is formed through an opening in the molding compound.

12. The apparatus of claim 10, wherein:
the heat dissipation structure comprises a first solder ball; and
the second heat dissipation structure comprises a second solder ball.

13. The apparatus of claim 10, wherein:
the package interconnect structure has (i) a first end that is attached to the interconnect layer and (ii) a second end that is opposite to the first end;
the first heat dissipation structure has (i) a first end that is attached to the inactive side of the semiconductor die and (ii) a second end that is opposite to the first end;
the second heat dissipation structure has (i) a first end that is attached to the inactive side of the semiconductor die and (ii) a second end that is opposite to the first end; and
prior to the package interconnect structure being attached to the second substrate, each of (i) the second end of the package interconnect structure, (ii) the second end of the first heat dissipation structure, and (iii) the second end of the second heat dissipation structure substantially lie in the same plane.

14. The apparatus of claim 10, wherein each of the first heat dissipation structure and the second heat dissipation structure is attached to the second substrate.

15. The apparatus of claim 10, further comprising:
a molding compound deposited to encapsulate at least the inactive side of the semiconductor die,
wherein each of the first heat dissipation structure and the second heat dissipation structure is formed through a corresponding opening in the molding compound.

16. The apparatus of claim 10, wherein:
the active side of the semiconductor die is attached to the interconnect layer via a bump; and
the package interconnect structure is larger in size than the bump.

17. The apparatus of claim 10, further comprising:
a dielectric layer formed directly on the first substrate, wherein the interconnect layer is formed on the dielectric layer.

18. The apparatus of claim 10, wherein the second substrate is a printed circuit board.

19. The apparatus of claim 10, wherein the active side of the semiconductor die is attached to the interconnect layer via a first bump, wherein the semiconductor die is a first semiconductor die, the apparatus further comprising:
a second semiconductor die attached to the interconnect layer using a second bump.

20. A method comprising:
forming an interconnect layer on a first substrate;
attaching an active side of a semiconductor die to the interconnect layer using a first bump;
attaching a package interconnect structure to the interconnect layer;
attaching the package interconnect structure to a second substrate such that (i) the interconnect layer is attached to the second substrate via the package interconnect structure, and (ii) the semiconductor die is disposed between the first substrate and the second substrate, wherein the active side of the semiconductor die faces the first substrate and an inactive side of the semiconductor die faces the second substrate, and wherein the package interconnect structure is a structure configured to interconnect the interconnect layer and the second substrate;
depositing a molding compound such that the molding compound encapsulates at least the inactive side of the semiconductor die, wherein the semiconductor die comprises (i) the active side and (ii) the inactive side that is opposite to the active side;
forming an opening in the molding compound such that (i) a first section of the inactive side of the semiconductor die is exposed through the opening and (ii) a second section of the inactive side of the semiconductor die is not exposed through the opening; and
forming a heat dissipation structure through the opening in the molding compound such that the heat dissipation structure is attached to the first section of the inactive side of the semiconductor die, wherein no heat dissipation structure is attached to the second section of the inactive side of the semiconductor die, wherein the molding compound encapsulates the second section of the inactive side of the semiconductor die, and wherein the heat dissipation structure comprises a solder ball.

* * * * *